United States Patent
Mitamura

(10) Patent No.: US 9,952,441 B2
(45) Date of Patent: Apr. 24, 2018

(54) OPTICAL MODULE

(71) Applicant: Fujitsu Optical Components Limited, Kawasaki-shi, Kanagawa (JP)

(72) Inventor: Nobuaki Mitamura, Saitama (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 15 days.

(21) Appl. No.: 15/358,553

(22) Filed: Nov. 22, 2016

(65) Prior Publication Data
US 2017/0153458 A1    Jun. 1, 2017

(30) Foreign Application Priority Data

Nov. 27, 2015 (JP) ................. 2015-232147

(51) Int. Cl.
| | |
|---|---|
| *G02B 27/14* | (2006.01) |
| *G02B 27/10* | (2006.01) |
| *H01S 5/0683* | (2006.01) |
| *G02B 5/26* | (2006.01) |
| *G02B 6/42* | (2006.01) |
| *G02B 6/293* | (2006.01) |

(52) U.S. Cl.
CPC ........... *G02B 27/1006* (2013.01); *G02B 5/26* (2013.01); *G02B 6/4215* (2013.01); *G02B 6/4286* (2013.01); *H01S 5/0683* (2013.01); *G02B 6/29365* (2013.01)

(58) Field of Classification Search
CPC .................................................. G02B 27/1006
USPC .......................................................... 359/634
See application file for complete search history.

(56) References Cited

U.S. PATENT DOCUMENTS

| | | | |
|---|---|---|---|
| 6,198,864 B1 | 3/2001 | Lemoff et al. | |
| 2015/0346433 A1* | 12/2015 | Tamura | H04B 10/506 398/82 |

FOREIGN PATENT DOCUMENTS

| | | |
|---|---|---|
| JP | 2000-162466 | 6/2000 |
| JP | 2008-90138 | 4/2008 |
| JP | 2010-211164 | 9/2010 |

\* cited by examiner

*Primary Examiner* — James Jones
(74) *Attorney, Agent, or Firm* — Staas & Halsey LLP

(57) ABSTRACT

The filter transmits a light beam of a second wavelength emitted from each of a plurality of second light sources, reflects other light beams incident from a direction intersecting a traveling direction of the light beam of the second wavelength, and outputs a combined light of the light beam of the second wavelength and the other light beams. The first optical element transmits part of the light beam of the first wavelength emitted from the first light source or part of the light beam of the second wavelength included in the combined light output from the filter, and reflects the other light beams excluding the part thereof in the direction intersecting the traveling direction. The first light receiving element receives the part of the light beam of the first wavelength transmitted by the first optical element or the part of the light beam of the second wavelength.

6 Claims, 8 Drawing Sheets

OPTICAL MODULE

CROSS-REFERENCE TO RELATED APPLICATION

This application is based upon and claims the benefit of priority of the prior Japanese Patent Application No. 2015-232147, filed on Nov. 27, 2015, the entire contents of which are incorporated herein by reference.

FIELD

The embodiments discussed herein are related to an optical module.

BACKGROUND

Conventionally, some optical modules used for an optical transmission device or the like are provided with an optical combiner for combining a plurality of light beams each having a different wavelength. The optical combiner includes, for example, band pass filters (BPFs) each of which transmits a light beam of a predetermined wavelength and reflects the other light beam to output a combined light and reflective elements each of which reflects the combined light output from the BPF, and combines the light beams of the wavelengths using a zigzag optical path formed by the BPFs and the reflective elements.

The optical module also includes photo diodes (PDs) behind laser diodes (LDs) each of which is a light source for emitting a light beam of each wavelength. The PD receives the light beam emitted rearward from the LD and monitors an optical power of the light beam of each wavelength for light beams combined by the optical combiner. The optical module uses the optical power monitored by the PD to perform automatic power control (APC) processing for constantly maintaining an output level of the LD.

In recent years, an optical module having a driver for supplying a drive signal to LDs, provided behind the LDs has been studied. The structure in which the driver is provided behind the LDs has advantages that the length of a data line over which the drive signal is propagated from the driver to the LD becomes short and degradation of the drive signal is suppressed. However, in such an optical module, because a space behind the LDs is occupied with the driver, it is difficult to dispose the PDs behind the LDs.

Accordingly, the disposition of PDs inside the optical combiner is being studied. For example, a technology is known in which a transmitting portion for transmitting part of the light beam is provided in a reflective element inside an optical combiner and the light beam passing through the transmitting portion of the reflective element is made incident on the PD provided behind the reflective element.

Patent Literature 1: Japanese Laid-open Patent Publication No. 2008-90138

However, in the conventional technology in which the transmitting portion for transmitting part of the light beam is provided in the reflective element inside the optical combiner, because the transmitting portion has no wavelength selectivity, combined light i.e. combined light including light beams of various wavelengths is incident on the PD from the BPF. Therefore, in the conventional technology, it is difficult to monitor optical power of each wavelength by the PD.

At this point, it is considered that an optical component having wavelength selectivity is additionally provided between the transmitting portion of the reflective element and the PD. However, if the optical component having the wavelength selectivity is provided additionally, the number of components are increased, which may cause the configuration to be complicated.

SUMMARY

According to an aspect of an embodiment, an optical module includes a first light source that emits a light beam of a first wavelength according to a drive signal; a plurality of second light sources that are arranged in parallel with the first light source, and emit light beams of second wavelengths according to a drive signal, the second wavelengths differing from each other; a driver that supplies the drive signal to the first light source and to each of the plurality of second light sources; and an optical combiner that combines the light beam of the first wavelength emitted from the first light source and the light beams of the second wavelengths emitted from the plurality of second light sources, wherein the optical combiner includes: a filter that is provided in each of the plurality of the second light sources, transmits a light beam of a second wavelength emitted from each of the plurality of second light sources, reflects other light beams incident from a direction intersecting a traveling direction of the light beam of the second wavelength, and outputs a combined light of the light beam of the second wavelength and the other light beams, a first optical element that transmits part of the light beam of the first wavelength emitted from the first light source or part of the light beam of the second wavelength included in the combined light output from the filter, and reflects the other light beams excluding the part in the direction intersecting the traveling direction, and a first light receiving element that receives the part of the light beam of the first wavelength transmitted by the first optical element or the part of the light beam of the second wavelength.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT(S)

Preferred embodiments of the present invention will be explained with reference to accompanying drawings. In the following embodiments, the same reference signs are assigned to the same components, and overlapping explanation will be omitted.

First Embodiment

Figure 1:
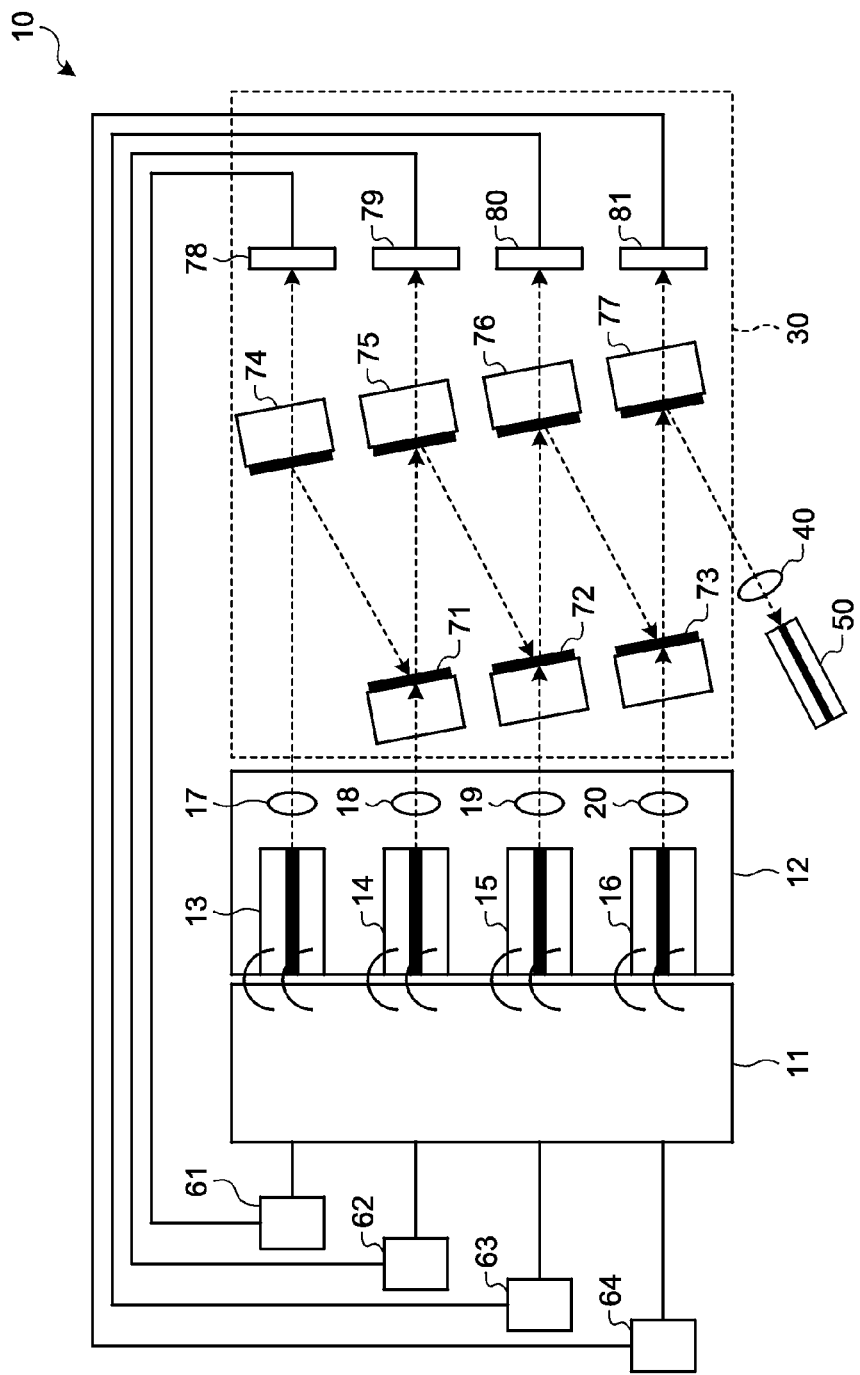
FIG. 1 is a diagram illustrating a configuration of an optical module according to a first embodiment.

A configuration of an optical module 10 according to a first embodiment will be explained first. FIG. 1 is a diagram illustrating the configuration of the optical module according to the first embodiment. As illustrated in FIG. 1, the optical module 10 includes a driver 11, a base member 12, LDs 13, 14, 15, and 16, lenses 17, 18, 19, and 20, an optical combiner 30, a lens 40, an optical fiber 50, and control circuits 61, 62, 63, and 64.

The driver 11 is provided behind the LDs 13, 14, 15, and 16, and supplies a drive signal to the LDs 13, 14, 15, and 16 via data lines that connect between the driver 11 and the LDs respectively.

The base member 12 holds the LDs 13, 14, 15, and 16 and the lenses 17, 18, 19, and 20.

The LDs 13, 14, 15, and 16 are arranged in parallel with each other along a predetermined arrangement direction, and emit a plurality of light beams each having a different wavelength. Specifically, the LD 13 is a starting light source provided at a start point in the predetermined arrangement direction, and emits a light beam of a wavelength $\lambda 1$ according to a drive signal supplied from the driver 11. The LDs 14, 15, and 16 are arranged in parallel with the LD 13, and emit light beams of wavelengths $\lambda 2$, $\lambda 3$, and $\lambda 4$, respectively, according to drive signals supplied from the driver 11. The LD 16 among the LDs 14, 15, and 16 is a terminal light source farthest from the LD 13, i.e., a terminal light source provided at a terminal point in the predetermined arrangement direction. The light beam of the wavelength $\lambda 1$ is an example of a "light beam of a first wavelength", and the light beams of the wavelengths $\lambda 2$, $\lambda 3$, and $\lambda 4$ are examples of "light beams of second wavelengths different from each other". Moreover, the LD 13 is an example of a "first light source", and the LDs 14, 15, and 16 are examples of "a plurality of second light sources".

The lenses 17, 18, 19, and 20 collimate the light beams respectively emitted from the LDs 13, 14, 15, and 16, i.e., the light beams of wavelengths $\lambda 1$, $\lambda 2$, $\lambda 3$, and $\lambda 4$ respectively, and output the light beams of the wavelengths after collimation to the optical combiner 30.

The optical combiner 30 combines the light beams of wavelengths $\lambda 1$, $\lambda 2$, $\lambda 3$, and $\lambda 4$ respectively output from the lenses 17, 18, 19, and 20, and outputs the combined light including the light beams of wavelengths $\lambda 1$, $\lambda 2$, $\lambda 3$, and $\lambda 4$. The optical combiner 30 includes PDs inside thereof, and monitors optical power of each wavelength by the PDs. Specifically, the optical combiner 30 includes BPFs 71, 72, and 73, optical elements 74, 75, 76, and 77, and PDs 78, 79, 80, and 81. The BPFs 71, 72, and 73 and the optical elements 74, 75, 76, and 77 form a zigzag optical path.

The BPFs 71, 72, and 73 are arranged in the LDs 14, 15, and 16 respectively, each of the BPFs transmits the light beam of the second wavelength emitted from each LD, reflects other light beams incident from a direction intersecting a traveling direction of the light beam of the second wavelength, and outputs a combined light of the light beam of the second wavelength and the other light beams. Specifically, the BPF 71 is provided in the LD 14, transmits the light beam of the wavelength $\lambda 2$, reflects other light beams incident from a direction intersecting the traveling direction of the light beam of the wavelength $\lambda 2$, and outputs the combined light of the light beam of the wavelength $\lambda 2$ and the other light beams. The BPF 72 is provided in the LD 15, transmits the light beam of the wavelength $\lambda 3$, reflects other light beams incident from a direction intersecting the traveling direction of the light beam of the wavelength $\lambda 3$, and outputs a combined light of the light beam of the wavelength $\lambda 3$ and the other light beams. The BPF 73 is provided in the LD 16, transmits the light beam of the wavelength $\lambda 4$, reflects other light beams incident from a direction intersecting the traveling direction of the light beam of the wavelength $\lambda 4$, and outputs a combined light of the light beam of the wavelength $\lambda 4$ and the other light beams.

Figure 2:
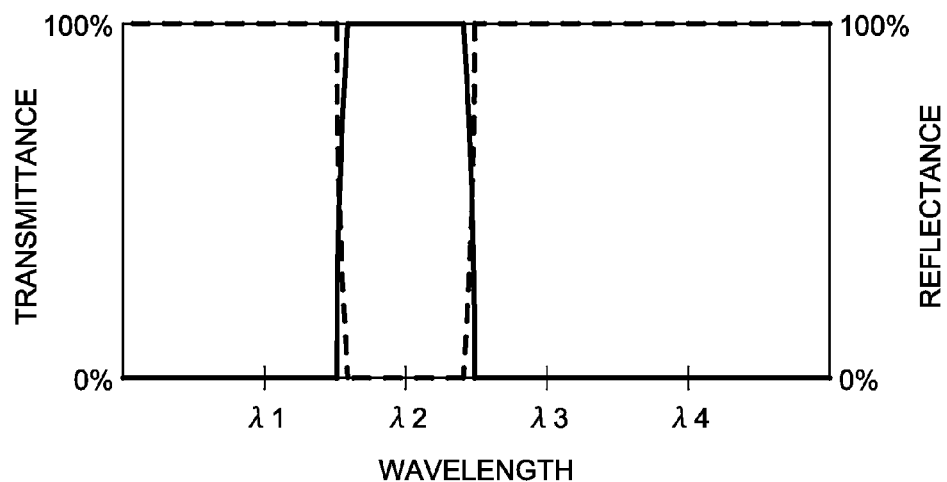
FIG. 2 is a diagram illustrating an example of wavelength characteristics of each BPF according to the first embodiment.
Figure 3:
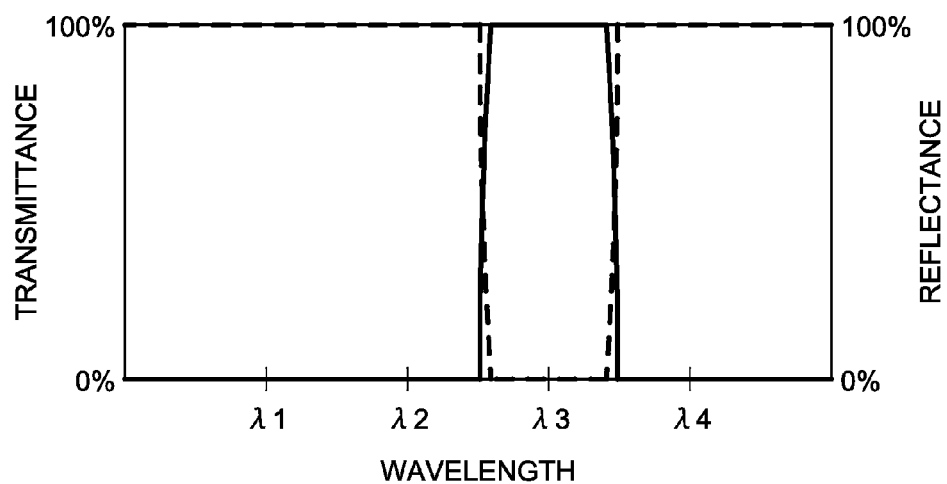
FIG. 3 is a diagram illustrating an example of the wavelength characteristics of each BPF according to the first embodiment.
Figure 4:
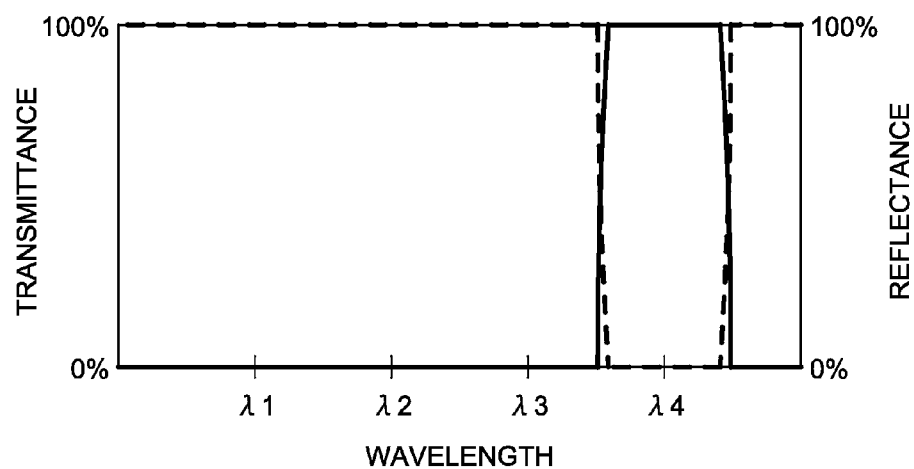
FIG. 4 is a diagram illustrating an example of the wavelength characteristics of each BPF according to the first embodiment.

The wavelength characteristics of the BPFs 71, 72, and 73 are represented as illustrated in FIG. 2 to FIG. 4, respectively. FIG. 2 to FIG. 4 are diagrams each illustrating an example of wavelength characteristics of each BPF according to the first embodiment. As illustrated in FIG. 2 to FIG. 4, a horizontal axis represents a wavelength, a vertical axis on the left side represents a transmittance of each BPF, and a vertical axis on the right side represents a reflectance of each BPF. The graph of the transmittance of each BPF is indicated by a solid line, and the graph of the reflectance of each BPF is indicated by a broken line. The BPF 71 transmits only the light beam of the wavelength $\lambda 2$ and reflects the light beams of the other wavelengths as illustrated in FIG. 2. The BPF 72 transmits only the light beam of the wavelength $\lambda 3$ and reflects the light beams of the other wavelengths as illustrated in FIG. 3. The BPF 73 transmits only the light beam of the wavelength $\lambda 4$ and reflects the light beams of the other wavelengths as illustrated in FIG. 4.

Referring back to the explanation of FIG. 1, the optical elements 74, 75, 76, and 77 transmit part of the light beam of the first wavelength emitted from the LD 13 or part of the light beam of the second wavelength included in the combined light output from each of the BPFs 71, 72, and 73, and reflect the other light beams excluding the part thereof in a direction intersecting the traveling direction of the light beam of the second wavelength. Specifically, the optical element 74 transmits part of the light beam of the wavelength $\lambda 1$ emitted from the LD 13, and reflects the light beam of the wavelength $\lambda 1$ excluding the part thereof as the other light beam to the BPF 71. The optical element 75 transmits part of the light beam of the wavelength $\lambda 2$ included in the combined light output from the BPF 71, and reflects the combined light excluding the part thereof as the other light beam to the BPF 72. The optical element 76 transmits part of the light beam of the wavelength λ3 included in the combined light output from the BPF 72, and reflects the combined light excluding the part thereof as the other light beam to the BPF 73. The optical element 77 transmits part of the light beam of the wavelength λ4 included in the combined light output from the BPF 73, and reflects the combined light excluding the part thereof as the other light beam to the optical fiber 50. The optical elements 74, 75, 76, and 77 are examples of a "first optical element".

Figure 5:
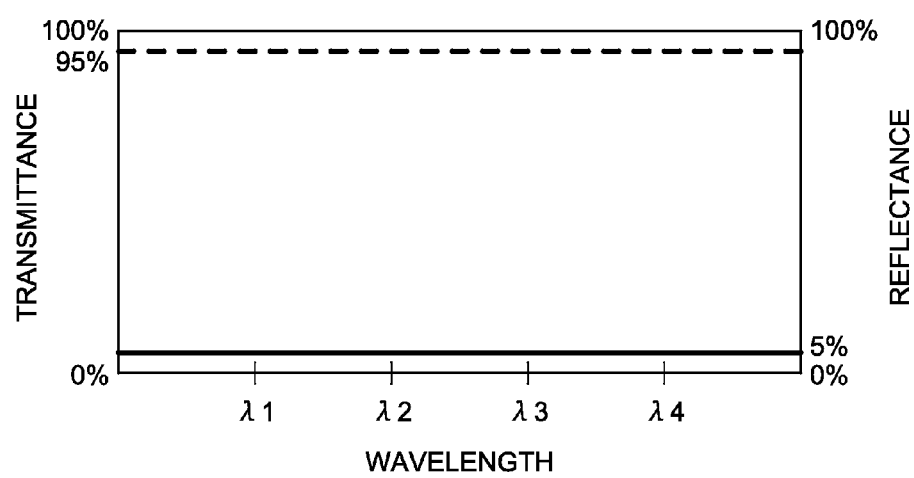
FIG. 5 is a diagram illustrating an example of wavelength characteristics of each optical element according to the first embodiment.
Figure 6:
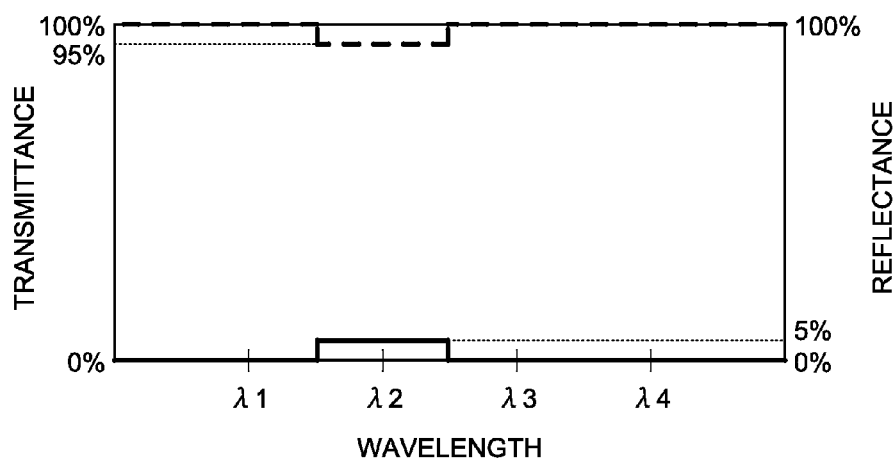
FIG. 6 is a diagram illustrating an example of the wavelength characteristics of each optical element according to the first embodiment.
Figure 7:
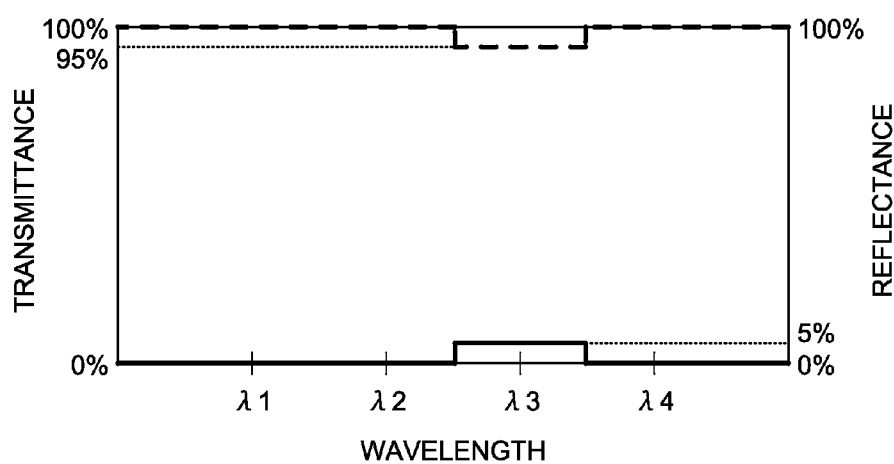
FIG. 7 is a diagram illustrating an example of the wavelength characteristics of each optical element according to the first embodiment.
Figure 8:
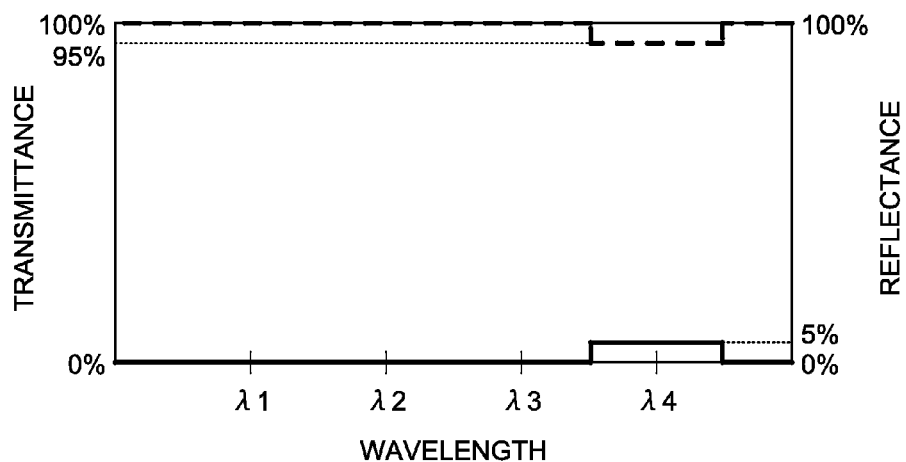
FIG. 8 is a diagram illustrating an example of the wavelength characteristics of each optical element according to the first embodiment.

The wavelength characteristics of the optical elements 74, 75, 76, and 77 are represented as illustrated in FIG. 5 to FIG. 8, respectively. FIG. 5 to FIG. 8 are diagrams each illustrating an example of wavelength characteristics of each optical element according to the first embodiment. As illustrated in FIG. 5 to FIG. 8, a horizontal axis represents a wavelength, a vertical axis on the left side represents a transmittance of each optical element, and a vertical axis on the right side represents a reflectance of each optical element. The graph of the transmittance of each optical element is indicated by a solid line, and the graph of the reflectance of each optical element is indicated by a broken line. As illustrated in FIG. 5, the optical element 74 transmits 5% corresponding to part of the incident light beam, and reflects 95% corresponding to the rest of the incident light beam. As illustrated in FIG. 6, the optical element 75 transmits 5% corresponding to part of the light beam of the wavelength λ2, and reflects 95% corresponding to the rest of the light beam of the wavelength λ2 and the light beams of the other wavelengths. As illustrated in FIG. 7, the optical element 76 transmits 5% corresponding to part of the light beam of the wavelength λ3, and reflects 95% corresponding to the rest of the light beam of the wavelength λ3 and the light beams of the other wavelengths. As illustrated in FIG. 8, the optical element 77 transmits 5% corresponding to part of the light beam of the wavelength λ4, and reflects 95% corresponding to the rest of the light beam of the wavelength λ4 and the light beams of the other wavelengths.

Figure 9:
FIG. 9 is a diagram illustrating an example of a structure of the optical element according to the first embodiment.

The optical element 74 includes, as illustrated in FIG. 9, a substrate 74-1, an optical film 74-2 formed on one side of the substrate 74-1, and an antireflection film 74-3 formed on the other side of the substrate 74-1. FIG. 9 is a diagram illustrating an example of a structure of the optical element according to the first embodiment. The substrate 74-1 is a substrate formed by a material having translucency such as glass. The optical film 74-2 transmits part of the incident light beam of the wavelength λ1 to the substrate 74-1 and reflects the rest of the light beam of the wavelength λ1. The antireflection film 74-3 prevents reflection of the light beam of the wavelength λ1 transmitted to the substrate 74-1 by the optical film 74-2. When the optical element 74 is provided in the optical combiner 30, the optical film 74-2 faces the LD 13 and the antireflection film 74-3 faces the PD 78.

Figure 10:
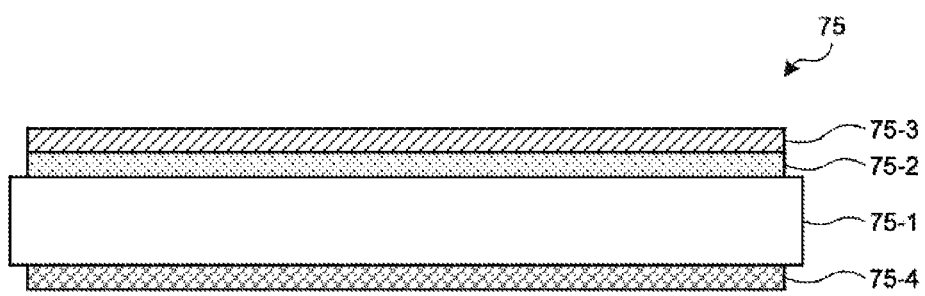
FIG. 10 is a diagram illustrating an example of the structure of the optical element according to the first embodiment.

The optical element 75 includes, as illustrated in FIG. 10, a substrate 75-1, an optical film 75-2 formed on one side of the substrate 75-1, a BPF 75-3 formed on the optical film 75-2, and an antireflection film 75-4 formed on the other side of the substrate 75-1. FIG. 10 is a diagram illustrating an example of the structure of the optical element according to the first embodiment. The substrate 75-1 is a substrate formed by a material having translucency such as glass. The optical film 75-2 transmits part of the light beam of the wavelength λ2 transmitted by the BPF 75-3 to the substrate 75-1 and reflects the rest of the light beam of the wavelength λ2 transmitted by the BPF 75-3 to the BPF 75-3. The BPF 75-3 transmits the light beam of the wavelength λ2 (the light beam of the wavelength λ2 toward the optical film 74-2 and the light beam of the wavelength λ2 reflected by the optical film 74-2), and reflects the light beams of the other wavelengths. The antireflection film 75-4 prevents reflection of the light beam of the wavelength λ2 transmitted to the substrate 75-1 by the optical film 75-2. When the optical element 75 is provided in the optical combiner 30, the BPF 75-3 faces the BPF 71 and the antireflection film 75-4 faces the PD 79.

The optical elements 76 and 77 have basically the same structure as that of the optical element 75 illustrated in FIG. 10. That is, each of the optical elements 76 and 77 includes a substrate, an optical film formed on one side of the substrate, a BPF formed on the optical film, and an antireflection film formed on the other side of the substrate. The BPF of the optical element 76 transmits the light beam of the wavelength λ3, and reflects the light beams of the other wavelengths. The BPF of the optical element 77 transmits the light beam of the wavelength λ4, and reflects the light beams of the other wavelengths.

Referring back to the explanation of FIG. 1, the PDs 78, 79, 80, and 81 receive part of the light beam of the first wavelength or part of the light beam of the second wavelength transmitted by the optical elements 74, 75, 76, and 77. Specifically, the PD 78 receives part of the light beam of the wavelength λ1 transmitted by the optical element 74. The PD 79 receives part of the light beam of the wavelength λ2 transmitted by the optical element 75. The PD 80 receives part of the light beam of the wavelength λ3 transmitted by the optical element 76. The PD 81 receives part of the light beam of the wavelength λ4 transmitted by the optical element 77. In this way, the PDs 78, 79, 80, and 81 receive respective parts of the light beams of the wavelengths, which enables monitoring of the light beam for each wavelength.

The lens 40 collects the combine light output by the optical combiner 30, i.e., the combined light reflected to the optical fiber 50 by the optical element 77.

The optical fiber 50 is provided along the direction intersecting the traveling direction of the light beam of the wavelength λ4 emitted from the LD 16 which is the terminal light source, and transmits the combined light output by the optical combiner 30.

The control circuits 61, 62, 63, and 64 control a drive signal supplied to each LD by the driver 11 based on a difference between a value indicating part of the light beam of the first wavelength or indicating part of the light beam of the second wavelength received by each of the PDs 78, 79, 80, and 81 and a predetermined target value. Specifically, the control circuit 61 controls a drive signal supplied to the LD 13 by the driver 11 based on a difference between a current value indicating part of the light beam of the wavelength λ1 received by the PD 78 and a target value. The control circuit 62 controls a drive signal supplied to the LD 14 by the driver 11 based on a difference between a current value indicating part of the light beam of the wavelength λ2 received by the PD 79 and a target value. The control circuit 63 controls a drive signal supplied to the LD 15 by the driver 11 based on a difference between a current value indicating part of the light beam of the wavelength λ3 received by the PD 80 and a target value. The control circuit 64 controls a drive signal supplied to the LD 16 by the driver 11 based on a difference between a current value indicating part of the light beam of the wavelength λ4 received by the PD 81 and a target value. The control circuits 61, 62, 63, and 64 are examples of a "first control unit".

An example of optical monitoring processing performed by the optical module 10 illustrated in FIG. 1 will be explained next. The light beam of the wavelength λ1 emitted from the LD 13 is collimated by the lens 17 to be incident on the optical element 74 of the optical combiner 30. Part of the light beam of the wavelength λ1 incident on the optical element 74 is transmitted by the optical element 74, and the rest of the light beam of the wavelength λ1 is reflected by the optical element 74 to the BPF 71. The part of the light beam of the wavelength λ1 transmitted by the optical element 74 is received by the PD 78. Thus, it becomes possible to perform monitoring of the light beam of the wavelength λ1.

The light beam of the wavelength λ2 emitted from the LD 14 is collimated by the lens 18 to be incident on the BPF 71 of the optical combiner 30. The light beam of the wavelength λ2 incident on the BPF 71 is transmitted by the BPF 71, and the light beam of the wavelength λ1 reflected by the optical element 74 is reflected again by the BPF 71. As a result, the light beam of the wavelength λ1 and the light beam of the wavelength λ2 are combined, and the obtained combined light, i.e., the combined light of the light beam of the wavelength λ1 and the light beam of the wavelength λ2 is incident on the optical element 75. Part of the light beam of the wavelength λ2 included in the combined light incident on the optical element 75 is transmitted by the optical element 75, and the rest of the combined light, i.e., the rest of the combined light of the light beam of the wavelength λ1 and the light beam of the wavelength λ2 is reflected by the optical element 75 to the BPF 72. The part of the light beam of the wavelength λ2 transmitted by the optical element 75 is received by the PD 79. Thus, it becomes possible to perform monitoring of the light beam of the wavelength λ2.

The light beam of the wavelength λ3 emitted from the LD 15 is collimated by the lens 19 to be incident on the BPF 72 of the optical combiner 30. The light beam of the wavelength λ3 incident on the BPF 72 is transmitted by the BPF 72, and the combined light reflected by the optical element 75, i.e., the combined light of the light beam of the wavelength λ1 and the light beam of the wavelength λ2 is reflected again by the BPF 72. As a result, the combined light of the light beam of the wavelength λ1 and the light beam of the wavelength λ2 and the light beam of the wavelength λ3 are combined, and the obtained combined light, i.e., the combined light of the light beam of the wavelength λ1, the light beam of the wavelength λ2, and the light beam of the wavelength λ3 is incident on the optical element 76. Part of the light beam of the wavelength λ3 included in the combined light incident on the optical element 76 is transmitted by the optical element 76, and the rest of the combined light, i.e., the rest of the combined light of the light beam of the wavelength λ1, the light beam of the wavelength λ2, and the light beam of the wavelength λ3 is reflected by the optical element 76 to the BPF 73. The part of the light beam of the wavelength λ3 transmitted by the optical element 76 is received by the PD 80. Thus, it becomes possible to perform monitoring of the light beam of the wavelength λ3.

The light beam of the wavelength λ4 emitted from the LD 16 is collimated by the lens 20 to be incident on the BPF 73 of the optical combiner 30. The light beam of the wavelength λ4 incident on the BPF 73 is transmitted by the BPF 73, and the combined light reflected by the optical element 76, i.e., the combined light of the light beam of the wavelength λ1, the light beam of the wavelength λ2, and the light beam of the wavelength λ3 is reflected again by the BPF 73. As a result, the combined light of the light beam of the wavelength λ1, the light beam of the wavelength λ2, and the light beam of the wavelength λ3 and the light beam of the wavelength λ4 are combined, and the obtained combined light, i.e., the combined light of the light beam of the wavelength λ1, the light beam of the wavelength λ2, the light beam of the wavelength λ3, and the light beam of the wavelength λ4 is incident on the optical element 77. Part of the light beam of the wavelength λ4 included in the combined light incident on the optical element 77 is transmitted by the optical element 77, and the rest of the combined light, i.e., the rest of the combined light of the light beam of the wavelength λ1, the light beam of the wavelength λ2, the light beam of the wavelength λ3, and light beam of the wavelength λ4 is reflected by the optical element 77 to the optical fiber 50. The part of the light beam of the wavelength λ4 transmitted by the optical element 77 is received by the PD 81. Thus, it becomes possible to perform monitoring of the light beam of the wavelength λ4.

Figure 11:
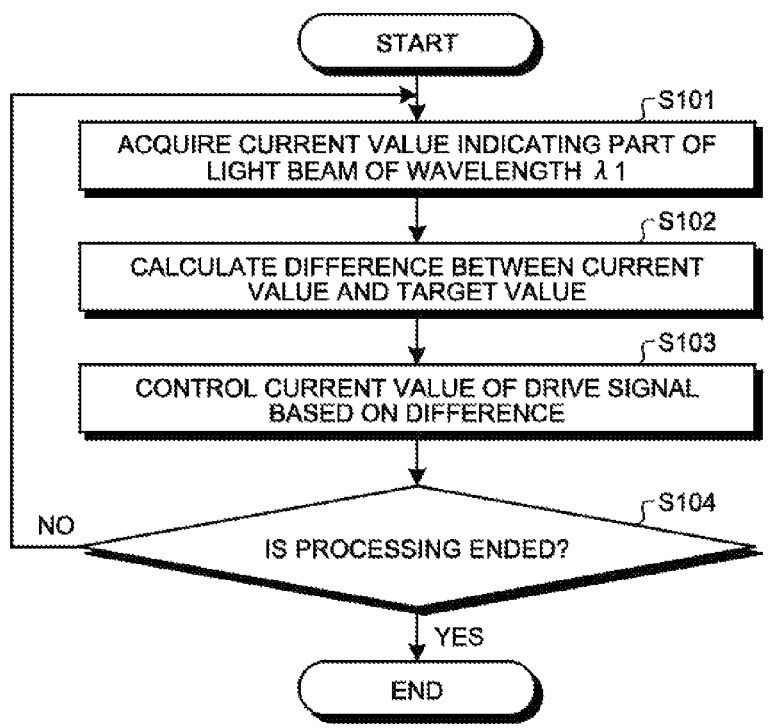
FIG. 11 is a flowchart illustrating an example of APC processing performed by the optical module according to the first embodiment.

An example of the APC processing performed by the optical module 10 illustrated in FIG. 1 will be explained next. FIG. 11 is a flowchart illustrating an example of the APC processing performed by the optical module according to the first embodiment. The APC processing performed by the control circuit 61 will be explained herein as an example.

As illustrated in FIG. 11, the control circuit 61 acquires a current value indicating part of the light beam of the wavelength λ1 received by the PD 78 (Step S101). The control circuit 61 calculates a difference between the current value indicating the part of the light beam of the wavelength λ1 and a target value (Step S102).

The control circuit 61 controls the current value of a drive signal to be supplied to the LD 13 by the driver 11 based on the calculated difference (Step S103). For example, when the current value indicating the part of the light beam of the wavelength λ1 is lower than the target value, the control circuit 61 increases the current value of the drive signal to be supplied to the LD 13 by the driver 11. In addition, for example, when the current value indicating the part of the light beam of the wavelength λ1 exceeds the target value, the control circuit 61 decreases the current value of the drive signal to be supplied to the LD 13 by the driver 11. Thereby the output level of the LD 13 can be maintained constantly even if the emission intensity of the LD 13 is changed due to secular change.

Thereafter, when the processing is not ended (No at Step S104), the control circuit 61 returns the processing to Step S101, and ends the APC processing when the processing is to be ended (Yes at Step S104).

As explained above, according to the present embodiment, the optical combiner 30 includes the BPFs 71, 72, and 73, the optical elements 74, 75, 76, and 77, and the PDs 78, 79, 80, and 81. The BPFs 71, 72, and 73 are arranged in LDs other than the LD that emits the light beam of the first wavelength, and each of the BPFs transmits the light beam of the second wavelength emitted from the LD, reflects the other light beams incident from the direction intersecting the traveling direction of the light beam of the second wavelength, and outputs a combined light of the light beam of the second wavelength and the other light beams. Each of the optical elements 74, 75, 76, and 77 transmits part of the light beam of the first wavelength or part of the light beam of the second wavelength included in the combined light output from each of the BPFs 71, 72, and 73, and reflects the other light beams excluding the part thereof in the direction intersecting the traveling direction of the light beam of the second wavelength. Each of the PDs 78, 79, 80, and 81 receives part of the light beam of the first wavelength or part of the light beam of the second wavelength transmitted by each of the optical elements 74, 75, 76, and 77. Therefore, the optical module 10 according to the present embodiment is capable of monitoring optical power of each wavelength using the PD. Moreover, the optical module 10 according to the present embodiment is capable of reducing the optical components having the wavelength selectivity, as compared with the conventional technology in which the transmitting portion for transmitting part of the light beam is provided in the reflective element inside the optical combiner, and therefore it is possible to avoid complication of the configuration. As a result, the optical module 10 according to the present embodiment is capable of monitoring optical power of each wavelength with a simple configuration.

According to the present embodiment, because the driver 11 is provided behind the LDs 13, 14, 15, and 16, the data line connecting between the driver 11 and each LD can be shortened, and degradation of the drive signal supplied to each LD can be suppressed. As a result, the optical module 10 according to the present embodiment is capable of monitoring optical power of each wavelength with a simple configuration while suppressing degradation of the drive signal supplied to each LD.

According to the present embodiment, the optical fiber 50 is provided along the direction intersecting the traveling direction of the light beam of the wavelength λ4 emitted from the LD 16 which is the terminal light source. The optical element 77 corresponding to the BPF 73 provided in the LD 16 transmits part of the light beam of the wavelength λ4 included in the combined light output from the BPF 73, and reflects the combined light excluding the part thereof to the optical fiber 50. Therefore, the optical module 10 according to the present embodiment is capable of monitoring optical power of each wavelength with a simple configuration while improving the flexibility of an arrangement configuration of the optical fiber 50.

Moreover, according to the present embodiment, each of the control circuits 61, 62, 63, and 64 controls a drive signal supplied to each LD by the driver 11 based on the difference between the value indicating part of the light beam of the first wavelength or indicating part of the light beam of the second wavelength received by each of the PDs 78, 79, 80, and 81 and the target value. Therefore, the optical module 10 according to the present embodiment is capable of constantly maintaining the output level of each LD even if the emission intensity of each LD is changed due to secular change.

Second Embodiment

A second embodiment will be explained next. An optical module according to the second embodiment has the same configuration as that of the optical module 10 according to the first embodiment except for the structure of the optical combiner and the arrangement configuration of the optical fiber. Therefore, in the second embodiment, the same reference signs are used for components common to these of the first embodiment, and detailed explanation thereof is omitted.

Figure 12:
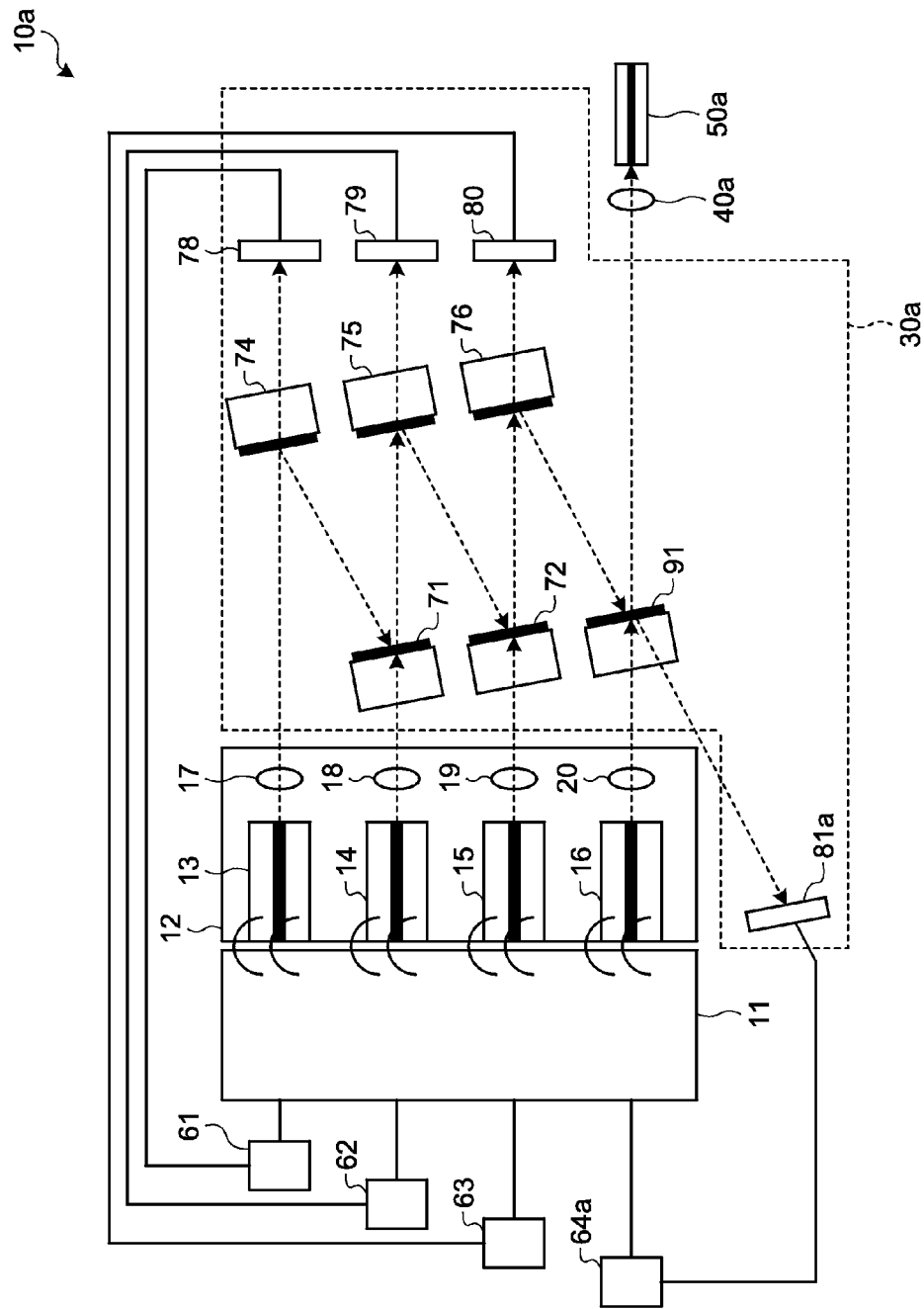
FIG. 12 is a diagram illustrating a configuration of an optical module according to a second embodiment.

FIG. 12 is a diagram illustrating a configuration of an optical module according to the second embodiment. In an optical module 10a illustrated in FIG. 12, an optical combiner 30a includes the BPFs 71 and 72, the optical elements 74, 75, and 76, an optical element 91, the PDs 78, 79, and 80, and a PD 81a. The BPFs 71 and 72, the optical elements 74, 75, and 76, and the optical element 91 form a zigzag optical path.

The BPFs 71 and 72 are arranged in the LDs 14 and 15 respectively, and each of the BPFs 71 and 72 transmits the light beam of the second wavelength emitted from each LD, reflects the other light beams incident from the direction intersecting the traveling direction of the light beam of the second wavelength, and outputs a combined light of the light beam of the second wavelength and the other light beams. In other words, in the present embodiment, the BPF is not provided in the LD 16 as the terminal light source.

The optical element 76 transmits part of the light beam of the wavelength λ3 included in the combined light output from the BPF 72, and reflects the combined light excluding the part thereof as the other light beam to the optical element 91.

The optical element 91 is provided in the LD 16 as the terminal light source. The optical element 91 reflects part of the light beam of the wavelength λ4 emitted from the LD 16, transmits the light beam of the wavelength λ4 excluding the part thereof, reflects the other light beams incident from the direction intersecting the traveling direction of the light beam of the wavelength λ4, and outputs a combined light of the light beam of the wavelength λ4 and the other light beams. Specifically, the optical element 91 combines the light beam of the wavelength λ4 and the combined light reflected by the optical element 76, i.e., the combined light of the light beam of the wavelength λ1, the light beam of the wavelength λ2, and the light beam of the wavelength λ3. The optical element 91 then outputs the obtained combined light, i.e., the combined light of the light beam of the wavelength λ1, the light beam of the wavelength λ2, the light beam of the wavelength λ3, and the light beam of the wavelength λ4 to an optical fiber 50a. The optical element 91 is an example of a "second optical element".

Figure 13:
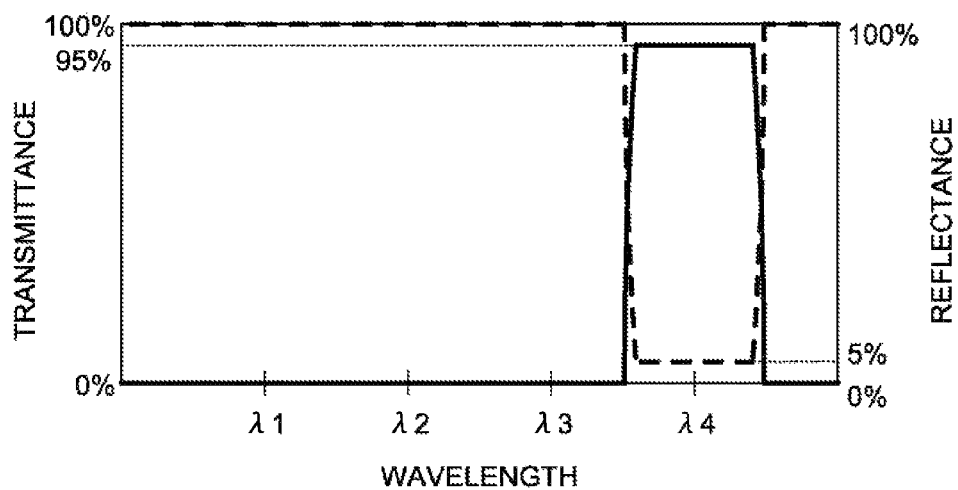
FIG. 13 is a diagram illustrating an example of wavelength characteristics of an optical element according to the second embodiment.

Wavelength characteristics of the optical element 91 are represented as illustrated in FIG. 13. FIG. 13 is a diagram illustrating an example of the wavelength characteristics of the optical element according to the second embodiment. As illustrated in FIG. 13, a horizontal axis represents a wavelength, a vertical axis on the left side represents a transmittance of the optical element 91, and a vertical axis on the right side represents a reflectance of the optical element 91. The graph of the transmittance of the optical element 91 is indicated by a solid line, and the graph of the reflectance of the optical element 91 is indicated by a broken line. As illustrated in FIG. 13, the optical element 91 reflects 5% corresponding to part of the light beam of the wavelengths λ4, transmits 95% corresponding to the rest of the light beam of the wavelength λ4, and reflects the light beams of the other wavelengths.

Figure 14:
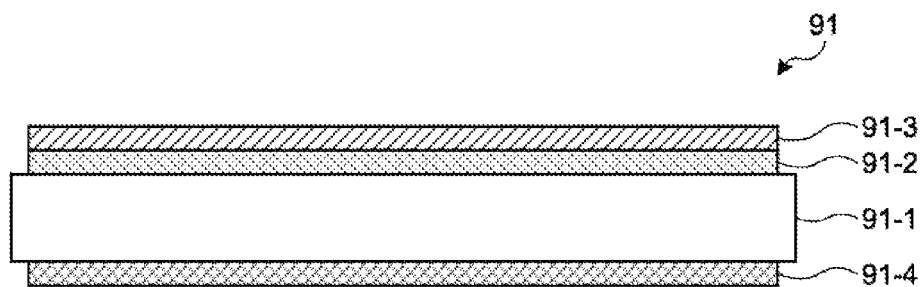
FIG. 14 is a diagram illustrating an example of a structure of the optical element according to the second embodiment.

The optical element 91 includes, as illustrated in FIG. 14, a substrate 91-1, an optical film 91-2 formed on one side of the substrate 91-1, a BPF 91-3 formed on the optical film 91-2, and an antireflection film 91-4 formed on the other side of the substrate 91-1. FIG. 14 is a diagram illustrating an example of the structure of the optical element according to the second embodiment. The substrate 91-1 is a substrate formed by a material having translucency such as glass. The optical film 91-2 reflects part of the light beam of the wavelength λ4 and transmits the rest of the light beam of the wavelength λ4 to the BPF 91-3. The BPF 91-3 transmits the light beam of the wavelength λ4 transmitted by the optical film 91-2, and reflects the light beams of the other wavelengths. The antireflection film 91-4 prevents reflection of the light beam of the wavelength λ4 to the optical film 91-2. When the optical element 91 is provided in the optical combiner 30a, the BPF 91-3 faces the optical fiber 50a, and the antireflection film 91-4 faces the LD 16.

Referring back to the explanation of FIG. 12, the PD 81a receives part of the light beam of the wavelength λ4 reflected by the optical element 91.

In the optical module 10a illustrated in FIG. 12, a lens 40a collects the combined light output by the optical combiner 30a, i.e., the combined light output by the optical element 91.

The optical fiber 50a is provided along the direction intersecting the traveling direction of the light beam of the wavelength λ4 emitted from the LD 16 which is the terminal light source, and transmits the combined light output by the optical combiner 30a.

A control circuit 64a controls a drive signal supplied to the LD 16 by the driver 11 based on a difference between a value indicating part of the light beam of the second wavelength received by the PD 81a and a predetermined target value. Specifically, the control circuit 64a controls a drive signal supplied to the LD 16 by the driver 11 based on a difference between a current value indicating part of the light beam of the wavelength λ4 received by the PD 81a and a target value. The control circuit 64a is an example of a "second control unit".

As explained above, according to the present embodiment, the BPF is not provided in the LD 16 as the terminal light source, and the optical combiner 30a includes the optical element 91 and the PD 81a. The optical element 91 is provided in the LD 16. The optical element 91 reflects part of the light beam of the wavelength λ4 emitted from the LD 16, transmits the light beam of the wavelength λ4 excluding the part thereof, reflects the other light beams incident from the direction intersecting the traveling direction of the light beam of the wavelength λ4, and outputs a combined light of the light beam of the wavelength λ4 and the other light beams. The PD 81a receives part of the light beam of the wavelength λ4 reflected by the optical element 91. Therefore, the optical module 10a according to the present embodiment is capable of monitoring the optical power of each wavelength using the PD. Moreover, the optical module 10a according to the present embodiment is capable of reducing the optical components having the wavelength selectivity, as compared with the conventional technology in which the transmitting portion for transmitting part of the light beam is provided in the reflective element inside the optical combiner, and therefore it is possible to avoid complication of the configuration. As a result, the optical module 10a according to the present embodiment is capable of monitoring optical power of each wavelength with a simple configuration. Furthermore, the optical module 10a according to the present embodiment is capable of reducing the BPFs as compared with the optical module according to the first embodiment.

According to the present embodiment, the optical fiber 50a is provided along the traveling direction of the light beam of the wavelength λ4 emitted from the LD 16 which is the terminal light source. The optical element 91 outputs the combined light to the optical fiber 50a. Therefore, the optical module 10a according to the present embodiment is capable of matching the direction in which a light beam is emitted from each PD and the arrangement direction of the optical fiber 50a, thereby improving implementation of the optical module 10a.

According to one aspect of the optical module disclosed in the present application, it is possible to monitor optical power of each wavelength with a simple configuration.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical module comprising:
   a first light source that emits a light beam of a first wavelength according to a drive signal;
   a plurality of second light sources that are arranged in parallel with the first light source, and emit light beams of second wavelengths according to a drive signal, the second wavelengths differing from each other;
   a driver that supplies the drive signal to the first light source and to each of the plurality of second light sources; and
   an optical combiner that combines the light beam of the first wavelength emitted from the first light source and the light beams of the second wavelengths emitted from the plurality of second light sources, wherein
   the optical combiner includes:
   a filter that is provided in each of the plurality of the second light sources, transmits a light beam of a second wavelength emitted from each of the plurality of second light sources, reflects other light beams incident from a direction intersecting a traveling direction of the light beam of the second wavelength, and outputs a combined light of the light beam of the second wavelength and the other light beams,
   a first optical element that transmits part of the light beam of the first wavelength emitted from the first light source or part of the light beam of the second wavelength included in the combined light output from the filter, and reflects the other light beams excluding the part in the direction intersecting the traveling direction, and
   a first light receiving element that receives the part of the light beam of the first wavelength transmitted by the first optical element or the part of the light beam of the second wavelength.

2. The optical module according to claim 1, further comprising:
   an optical fiber provided along a direction intersecting a traveling direction of a light beam of a second wavelength emitted from a terminal light source which is the farthest second light source from the first light source, of the plurality of second light sources, wherein
   the first optical element corresponding to the filter provided in the terminal light source transmits part of the light beam of the second wavelength included in the combined light output from the filter, and reflects the combined light excluding the part to the optical fiber.

3. The optical module according to claim 1 wherein
   the filter is not provided in a terminal light source which is the farthest second light source from the first light source, of the plurality of second light sources, and
   the optical combiner further includes:
   a second optical element that is provided in the terminal light source, reflects part of a light beam of a second wavelength emitted from the terminal light source, transmits the light beam of the second wavelength excluding the part, reflects the other light beams incident from the direction intersecting the traveling direction of the light beam of the second wavelength, and outputs a combined light of the light beam of the second wavelength and the other light beams, and a second light receiving element that receives the part of the light beam of the second wavelength reflected by the second optical element.

4. The optical module according to claim 3, further comprising:

an optical fiber provided along the traveling direction of the light beam of the second wavelength emitted from the terminal light source, wherein the second optical element outputs the combined light to the optical fiber.

5. The optical module according to claim 1, further comprising:

a first control unit that controls the drive signal supplied to the first light source and the second light source by the driver based on a difference between a value indicating the part of the light beam of the first wavelength received by the first light receiving element or indicating the part of the light beam of the second wavelength and a predetermined target value.

6. The optical module according to claim 3, further comprising:

a first control unit that controls the drive signal supplied to the first light source and each of the plurality of second light sources excluding the terminal light source by the driver based on a difference between a value indicating the part of the light beam of the first wavelength received by the first light receiving element or indicating the part of the light beam of the second wavelength and a predetermined target value; and a second control unit that controls the drive signal supplied to the terminal light source by the driver based on a difference between a value indicating the part of the light beam of the second wavelength received by the second light receiving element and the target value.

* * * * *